United States Patent
Miyamoto et al.

(10) Patent No.: US 6,424,052 B1
(45) Date of Patent: Jul. 23, 2002

(54) ALIGNMENT MARK FOR ELECTRON BEAM LITHOGRAPHY

(75) Inventors: Yasuyuki Miyamoto, Nagareyama (JP); Hiroo Hongo, Stuttgart (DE)

(73) Assignee: Tokyo Institute of Technology, Tokyo (JP)

( * ) Notice: Subject to any disclaimer, the term of this patent is extended or adjusted under 35 U.S.C. 154(b) by 0 days.

(21) Appl. No.: 09/154,250

(22) Filed: Sep. 16, 1998

(30) Foreign Application Priority Data

Mar. 13, 1998 (JP) .......................................... 10-062978

(51) Int. Cl.$^7$ ........................ H01L 23/544; H01L 21/76
(52) U.S. Cl. ....................................... 257/797; 438/401
(58) Field of Search ....................... 257/797; 356/124, 356/345, 353, 354, 355, 399, 401; 438/401

(56) References Cited

U.S. PATENT DOCUMENTS

| | | | | |
|---|---|---|---|---|
| 3,712,740 A | * | 1/1973 | Hennings ................. 356/152.2 |
| 3,832,561 A | * | 8/1974 | O'Keeffe ................. 250/492.1 |
| 4,123,661 A | * | 10/1978 | Wolf et al. ................. 250/492 |
| 4,152,601 A | * | 5/1979 | Kadota et al. ................. 378/35 |
| 4,954,717 A | * | 9/1990 | Sakamoto et al. ....... 250/492.3 |
| 5,112,133 A | * | 5/1992 | Kurosawa et al. .......... 356/401 |
| 5,162,240 A | * | 11/1992 | Saitou et al. .................. 427/8 |
| 5,493,403 A | * | 2/1996 | Nishi ......................... 356/401 |
| 5,897,371 A | * | 4/1999 | Yeh et al. .................... 438/633 |
| 5,978,085 A | * | 11/1999 | Smith et al. ................. 356/354 |

FOREIGN PATENT DOCUMENTS

| JP | 58-56334 | 4/1983 |
|---|---|---|
| JP | 58-223327 | 12/1983 |

\* cited by examiner

*Primary Examiner*—Trung Dang
*Assistant Examiner*—Brook Kebede
(74) *Attorney, Agent, or Firm*—Venable; Michael A. Sartori

(57) ABSTRACT

An alignment mark for use in electron beam lithography for manufacturing a fine semiconductor structure by repeating a regrowth of a compound semiconductor layer and a fine process including electron beam exposure. The alignment mark includes a lower protection layer made of tungsten formed on a compound semiconductor substrate, a mark main body made of gold, chromium or platinum shaped into a desired pattern having a sharp edge profile which generates a detection signal of a mark position having a large gain, and an upper protection layer covering the mark main body and made of silicon oxide which does not react significantly with substances constituting a compound semiconductor layer. The mark main body has a thickness which is not less than 100 nm.

10 Claims, 4 Drawing Sheets

FIG_2
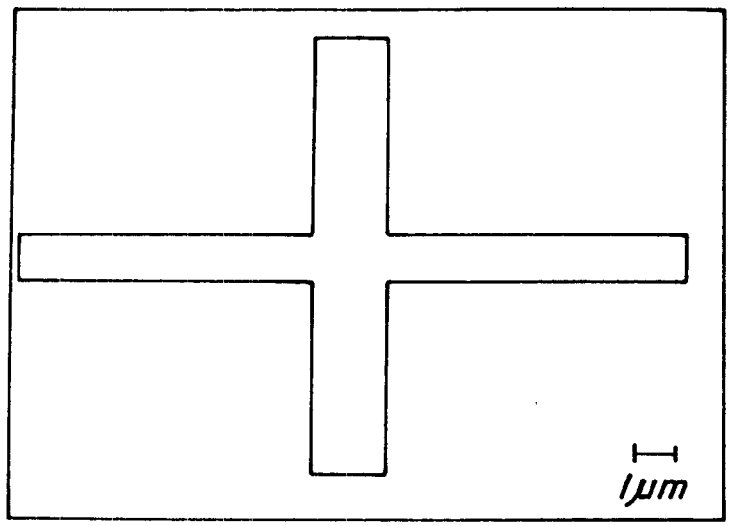
FIG_3
PRIOR ART
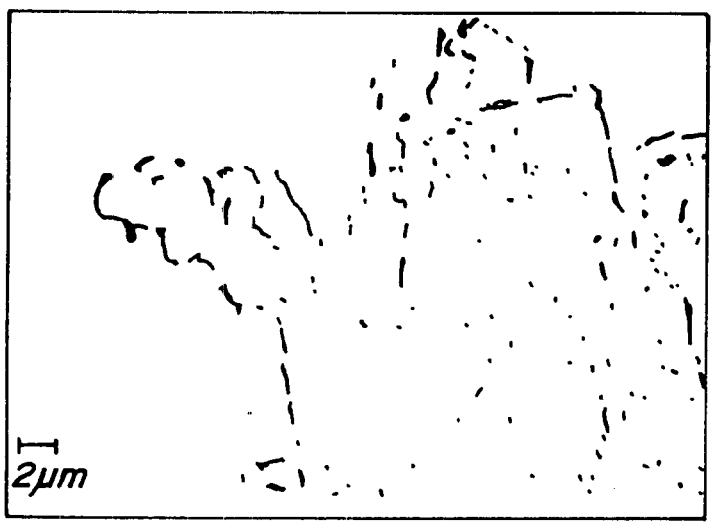

FIG_4A
*PRIOR ART*
FIG_4B
*PRIOR ART*
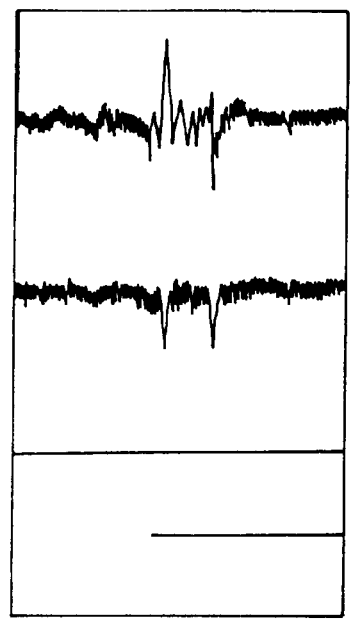
FIG_5A
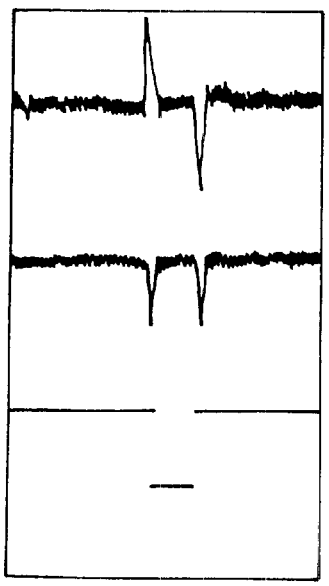
FIG_5B
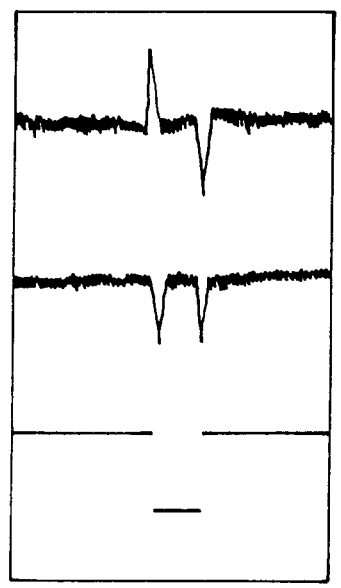

ALIGNMENT MARK FOR ELECTRON BEAM LITHOGRAPHY

BACKGROUND OF THE INVENTION

1. Field of the Invention

The present invention relates to an alignment mark for use in electron beam lithography, and more particularly to a composite alignment mark for use in a multi-level electron beam lithography process. Such an alignment mark has been used in a fabrication of an ultra-fine arbitrary pattern. Particularly, upon fabricating ultra-fine semiconductor structures by repeating regrowth of a compound semiconductor layer and a fine process using an electron beam exposure, such an alignment mark is preferably used for performing an alignment of a position of the electron beam exposure.

2. Description of the Related Art

Heretofore, by repeating a fine process using electron beam exposure and a regrowth of a compound semiconductor layer, it is possible to fabricate ultra-fine semiconductor structures having any desired construction. To this end, the alignment mark is an indispensable tool in the multilevel electron beam lithography. In other words, in order to align the electron beam lithography before and after a crystal regrowth, the alignment mark should remain stable after the crystal regrowth.

The inventors have proposed a compound semiconductor device with a double-slit and multi-fine electrodes for confirming interference/diffraction of hot electrons in semiconductors. The period of the interference pattern by the double-slit is expressed by $L\lambda/d$, wherein L is the distance from the slit to the multi-fine electrodes, $\lambda$ is the wavelength of hot electrons, and d is the pitch of the slit. The double-slit consists of a buried fine hetero-structure which can be advantageously fabricated by electron beam lithography.

The alignment mark for use in the electron beam lithography should satisfy various conditions. That is, the alignment mark should be stable in regrowth of a compound semiconductor crystal. If the alignment mark is made of a material which easily reacts with substances constituting a compound semiconductor layer, the alignment mark might be deformed in the regrowth. In order to generate a position detection signal having a large gain, it is necessary to generate a large amount of reflected electrons. To this end, the alignment mark should have a thickness on the order of 100 nm and should be made of a material having a large atomic number Z. In order to perform an alignment with an extremely high precision, the alignment mark should have a sharp cross sectional configuration, i.e. a sharp edge profile.

The gain of a detection signal detecting an alignment mark position is strongly dependent on a back-scattering coefficient of the mark material as well as on an edge profile. The back-scattering coefficient is proportional to the thickness of the alignment mark and the square of the atomic number Z of the mark material. This means that the mark material should have a larger back-scattering coefficient than that of the semiconductor substrate and have a steep edge profile.

There has been proposed an alignment mark made of gold (Au: Z=79). However, such a known alignment mark is liable to form an alloy together with atoms such as Ga and In constituting a compound semiconductor layer during a regrowth of the compound semiconductor layer, and thus a mark pattern might be deformed in the regrowth and the position of the mark could not be detected accurately. Therefore, it is difficult to perform a multi-level electron beam lithography using the known alignment mark made of gold. It has been also proposed to make an alignment mark of tungsten (W: Z=74) which hardly forms an alloy with atoms constituting the compound semiconductor layer. However, in this case, the alignment mark could not have a sharp edge profile. Conventional evaporation with liftoff has been found to be difficult due to a high melting point and a deposition by sputtering had a problem of uniformity and a broader edge. Such an alignment mark without a sharp edge profile could not be advantageously used in electron beam lithography.

The alignment mark may be made of platinum (Pt: Z=78). The platinum alignment mark can be formed by a conventional evaporation and a sharp edge profile can be obtained. However, this alignment mark is not as stable in a regrowth as tungsten. Since the crystal regrowth has no selectivity and a GaInAs layer is grown also on the mark, the detection signal might contain noise. After the crystal regrowth, a surface of the platinum alignment mark becomes rough, and thus noise is introduced in the detection signal. Therefore the position of the alignment mark could not be detected accurately. Although position recognition of the platinum alignment mark is still possible and a next electron beam exposure can be performed by utilizing the mark, reproductivity is poor.

SUMMARY OF THE INVENTION

The present invention has for its object to provide a novel and useful alignment mark for use in electron beam lithography, by means of which a fine semiconductor structure can be accurately manufactured by repeating a regrowth of a compound semiconductor layer and a fine process using electron beam exposure, and whose sharp edge profile is stably maintained in a crystal regrowth of a compound semiconductor layer.

According to the invention, an alignment mark for use in electron beam lithography for manufacturing a fine semiconductor structure by repeating a regrowth of a compound semiconductor layer and a fine process including an electron beam exposure comprises:

a mark main body made of a material which can be shaped into a desired pattern having a sharp edge profile and can generate a detection signal of a mark position having a large gain; and a protection layer completely covering said mark main body and made of a material which hardly reacts with substances constituting a compound semiconductor layer. That is, the protection layer is made of a material which does not react significantly with such substances.

As stated above, the alignment mark according to the invention is composed of the two members, i.e. the mark main body and the protection layer, and therefore may be called a composite alignment mark.

According to the invention, said mark main body may be made of a material such as gold, chromium, platinum or a stack of these metal layers, and said protection layer may be made of tungsten or $SiO_2$. In a preferable embodiment of the alignment mark according to the invention, the mark main body is formed by a stack of a gold layer and a chromium layer, and said protection layer is formed by a lower protection layer made of tungsten and an upper protection layer made of silicon oxide.

According to the invention, it is important that the mark main body is completely covered with said protection layer. If a side edge of the mark main body is not covered with the protection layer, but is exposed, an undesired deformation of the alignment mark might occur.

In case of manufacturing the composite alignment mark according to the invention, at first a lower protection layer is formed on a compound semiconductor substrate, a mark main body is formed on the lower protection layer in accordance with a desired pattern, and then an upper protection layer is formed on the mark main body such that the mark main body is completely covered with the lower and upper protection layers.

BRIEF DESCRIPTION OF THE DRAWINGS

FIG. 2 is a plan view illustrating a two-dimensional configuration of the alignment mark according to the invention shown in FIG. 1;

FIG. 3 is a plan view depicting a known alignment mark made of gold after a crystal regrowth of a compound semiconductor layer;

FIGS. 4A and 4B are waveforms of a detection signal of a mark position obtained by using a known alignment mark made of platinum before and after a crystal regrowth of a compound semiconductor layer, respectively;

FIGS. 5A and 5B are waveforms of a detection signal of a mark position obtained by the alignment mark according to the invention.

DESCRIPTION OF THE PREFERRED EMBODIMENT

Figure 1:
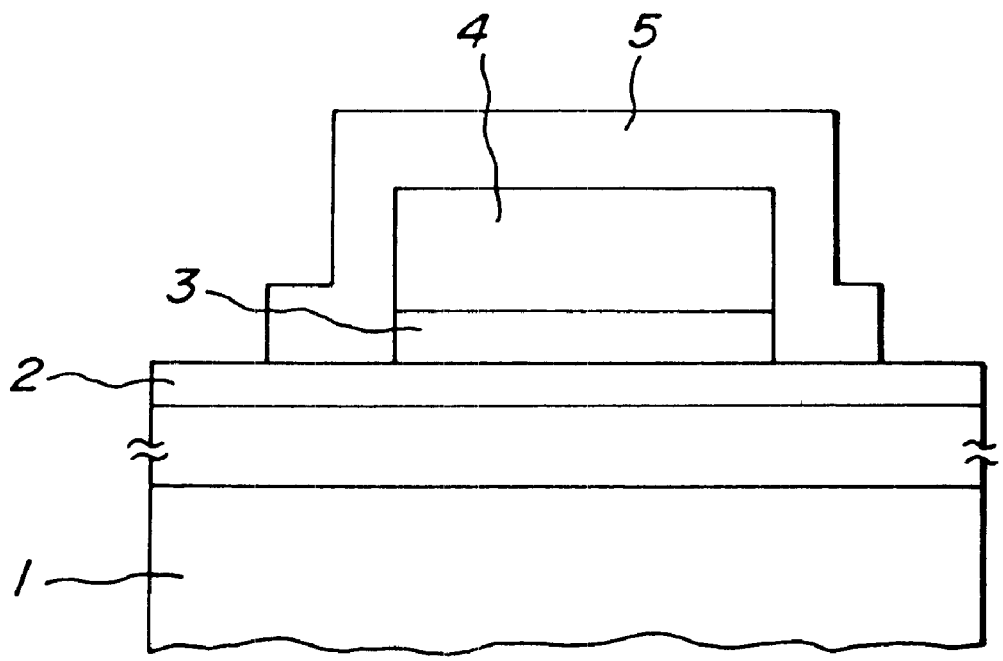
FIG. 1 is a cross sectional view showing an embodiment of the alignment mark according to the invention formed on a semiconductor structure.

FIG. 1 is a cross sectional view showing an embodiment of the composite alignment mark according to the invention formed on a semiconductor structure. An ultra-fine semiconductor structure comprises a compound semiconductor substrate 1 and a multi-layer compound semiconductor layer 2 formed on the compound semiconductor substrate. The compound semiconductor substrate 1 is made of InP, and the multi-layer compound semiconductor layer is formed by InP/GaInAs. The alignment mark is formed on the compound semiconductor layer 2. The alignment mark is formed in the following manner. At first, a lower protection layer 3 is formed on the compound semiconductor layer 2 such that the lower protection layer covers an area on which the alignment mark is to be formed. The lower protection layer 3 is made of a material which hardly reacts with substances constituting the compound semiconductor layer 2 as well as a compound semiconductor layer to be formed on the compound semiconductor layer 2. In the present embodiment, the lower protection layer 3 is formed by a tungsten layer having a thickness of 30 nm. On the lower protection layer 3, is formed a mark main body 4 made of a material which can be easily shaped to have a sharp edge profile. Further, the mark main body 4 is made of a material having a large atomic number and has a thickness of about 100 nm in order to obtain a detection signal of mark position having a large gain. In the present embodiment, the mark main body 4 is composed of a gold layer having a thickness of 100 nm and a Cr layer having a thickness of 10 nm. Since the alignment mark is utilized to detect a two-dimensional position on a plane, the mark main body 4 is formed into the a shape of a cross having a sharp edge profile as shown in FIG. 2. On the mark main body 4, is formed an upper protection layer 5 made of a material similar to or same as that of the lower protection layer 3. In the present embodiment, the upper protection layer is made of silicon oxide ($SiO_2$). According to the invention, it is important that the lower and upper protection layers 3 and 5 are formed such that the mark main body 4 is completely covered with these protection layers. Therefore, when a compound semiconductor layer is grown on the alignment mark, the mark main body 4 is not brought into contact with substances constituting the compound semiconductor layer, and thus even if the mark main body 4 is made of a material such as gold and platinum which is liable to react with the substances of the compound semiconductor layers, the mark main body 4, and thus the alignment mark are not deformed at all in the regrowth.

In the known alignment mark having the same shape as that shown in FIG. 2, but being made of gold, after a regrowth of a compound semiconductor layer, the original shape of the alignment mark is completely destroyed as illustrated in FIG. 3. As stated above, when the alignment mark is made of platinum, the deformation of the mark in the regrowth is not so large as that of the gold mark, but still could not be ignored.

FIGS. 4A and 4B are waveforms of the detection signal obtained by the above mentioned platinum mark before and after the crystal regrowth. In these drawings, a horizontal axis represents the position of an electron beam, the uppermost figures denotes a differentiated value of the detection signal, the middle figures an absolute value of the differentiated value and the lowermost figures, the position of the alignment mark detected by the detection signal. As can be seen from FIG. 4B, after the growth of the compound semiconductor layer, the right hand edge of the mark is not detected.

FIGS. 5A and 5B show waveforms of the detection signal obtained by the composite alignment mark according to the invention before and after the crystal regrowth. From these drawings, it can be understood that even after the crystal growth, the edges of the alignment mark can be detected accurately.

It should be noted that according to the invention, it is important that the mark main body be completely covered with the protection layers, otherwise the alignment mark might be deformed in the crystal regrowth. That is to say, when the protection layer is formed such that a side edge of the mark main body is not covered with the protection layer, the mark is deformed in the regrowth.

Figure 6:
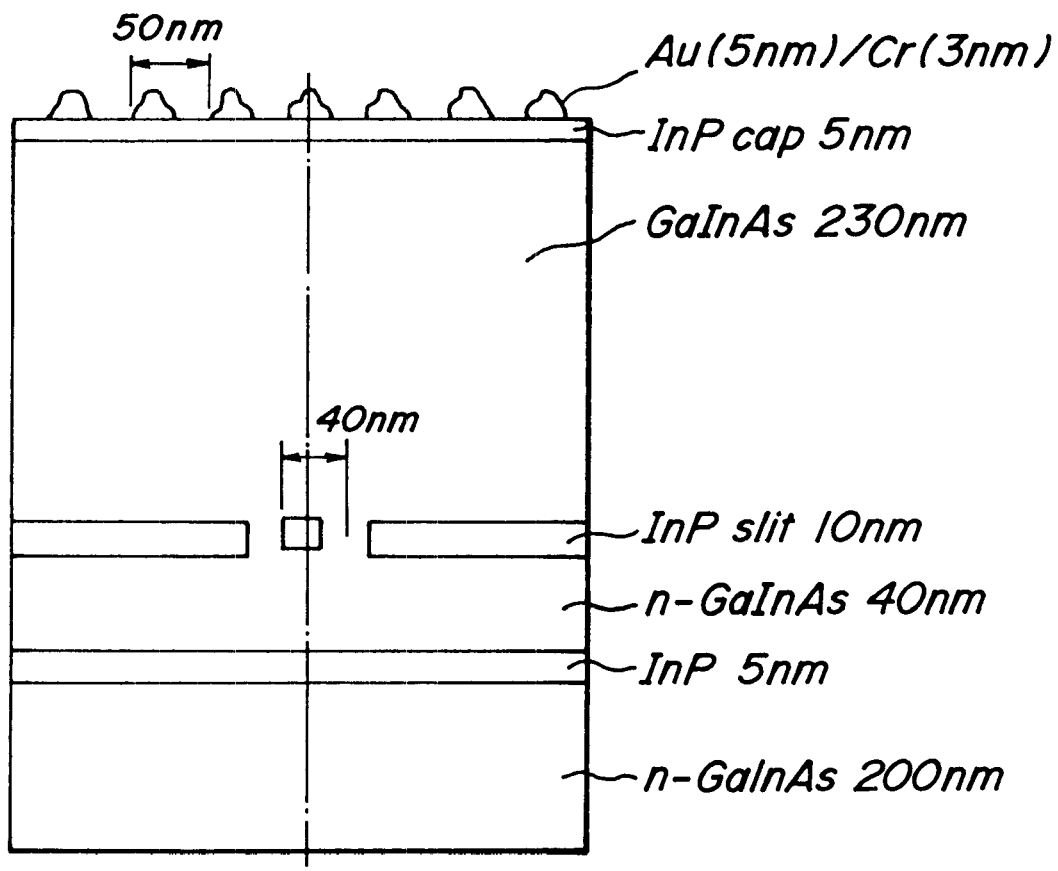
FIG. 6 is a schematic cross sectional view illustrating a semiconductor structure comprising an InP/GaInAs 40-nm-double-slit structure and a periodic mesa type electrode structure fabricated by using the alignment mark according to the invention.

FIG. 6 is a schematic cross sectional SEM view showing an ultra-fine semiconductor structure including a 40-nm-pitch buried double-slit and 50-nm-pitch Cr/Au electrodes manufactured by using the composite alignment mark according to the invention shown in FIG. 1. The Cr/Au electrodes can be aligned with an overlay accuracy of about 20 nm.

As explained above, the present invention can provide a novel and useful composite alignment mark for use in electron beam lithography. By means of such a composite alignment mark, a nano-fabrication process with regrowth can be performed accurately. The deformation of the composite alignment mark according to the invention after regrowth is very little, and thus the fine fabrication process can be conducted in a highly reproductive manner. By performing the multi-level electron beam lithography involving the crystal regrowth using the composite alignment mark according to the invention, the fine semiconductor structure with buried 20-nm-pitch GaInAs/InP grating aligned 50-nm-pitch fine multi-electrodes can be manufactured reliably.

What is claimed is:

1. An alignment mark for use in electron beam lithography for manufacturing a fine semiconductor structure by repeating a regrowth of a compound semiconductor layer and a fine process including electron beam exposure comprising:

a mark main body formed by a stack consisting of a gold layer and a chromium layer shaped into a desired pattern having a sharp edge profile, said mark main body generating a detection signal of a mark position having a large gain; and a protection layer completely covering said mark main body, said protection layer being made of a material which does not react significantly with substances constituting a compound semiconductor layer.

2. An alignment mark according to claim 1, wherein said gold layer and said chromium layer have thickness of about 100 nm and 10 nm, respectively.

3. A method for generating an alignment mark for use in electron beam lithography comprising the steps of forming a multi-layer compound semiconductor layer on a semiconductor substrate, said compound semiconductor layer being subject to crystal regrowth during exposure to an electron beam;

forming a first protection layer on said multi-layer compound semiconductor layer, said first protection layer being made of a material which does not react significantly with substances constituting said multi-layer compound semiconductor layer;

forming a mark main body on said first protection layer, said mark main body consisting of a gold layer and a chromium layer shaped into a desired pattern having a sharp edge profile, said mark main body generating a detection signal of a mark position having a large gain; and forming a second protection layer on the main mark body, said second protection layer being made of a material which does not react significantly with substances constituting said multi-layer compound semiconductor layer, said first and second protection layers completely covering said mark main body, whereby a stable alignment mark is obtained which is not deformed during crystal regrowth of said compound semiconductor layer.

4. The method for generating an alignment mark for use in electron beam lithography according to claim 3, wherein said multi-layer compound semiconductor layer is composed of InP/GaInAs.

5. The method for generating an alignment mark for use in electron beam lithography according to claim 3, wherein said first protection layer is composed of tungsten.

6. The method for generating an alignment mark for use in electron beam lithography according to claim 3, wherein said mark main body has a thickness of about 100 nm, said gold layer has a thickness of about 100 nm and said chromium layer has a thickness of about 10 nm.

7. The method for generating an alignment mark for use in electron beam lithography according to claim 3, wherein said mark main body is in the shape of a cross having said sharp edge profile.

8. The method for generating an alignment mark for use in electron beam lithography according to claim 3, wherein said second protection layer is composed of silicon dioxide.

9. The method for generating an alignment mark for use in electron beam lithography according to claim 3, wherein one of said first and second protection layers is composed of tungsten and the other of said protection layers is composed of silicon dioxide.

10. The method for generating an alignment mark for use in electron beam lithography according to claim 9, wherein said multi-layer compound semiconductor layer is composed of InP/GaInAs.

* * * * *